United States Patent
Ekbote et al.

(10) Patent No.: US 7,792,560 B2
(45) Date of Patent: Sep. 7, 2010

(54) PROCESS FOR THE PREPARATION OF LOW CONTACT RESISTANT CONTACT ON A HIGH TRANSITION TEMPERATURE SUPERCONDUCTORS

(75) Inventors: Shrikant Ekbote, New Delhi (IN); Gursharan Kaur Padam, New Delhi (IN); Narendra Kumar Arora, New Delhi (IN); Mukul Sharma, New Delhi (IN); Ramesh Sethi, New Delhi (IN); Mrinal Kanti Banerjee, New Delhi (IN)

(73) Assignee: Council of Scientific and Industrial Research, New Delhi (IN)

( * ) Notice: Subject to any disclaimer, the term of this patent is extended or adjusted under 35 U.S.C. 154(b) by 725 days.

(21) Appl. No.: 10/594,018

(22) PCT Filed: Mar. 31, 2004

(86) PCT No.: PCT/IB2004/001013
§ 371 (c)(1),
(2), (4) Date: Jul. 10, 2007

(87) PCT Pub. No.: WO2005/096440
PCT Pub. Date: Oct. 13, 2005

(65) Prior Publication Data
US 2007/0281862 A1    Dec. 6, 2007

(51) Int. Cl.
*H01B 12/00*  (2006.01)
*H01L 39/24*  (2006.01)
*H01R 4/68*   (2006.01)
*B05D 5/12*   (2006.01)

(52) U.S. Cl. ............... 505/220; 505/230; 505/430; 505/470; 505/706; 505/121; 174/125.1; 174/126.1; 174/15.4; 29/599; 335/216; 419/6; 148/521

(58) Field of Classification Search ......... 505/220, 505/230, 231, 430, 431, 470–471, 705, 706, 505/121, 126, 782; 29/599; 174/125.1, 126.1; 427/62
See application file for complete search history.

(56) References Cited

U.S. PATENT DOCUMENTS 5,480,728 A    1/1996    Tkaczyk et al.

(Continued)

FOREIGN PATENT DOCUMENTS

JP    06163255    *    6/1992

(Continued)

OTHER PUBLICATIONS

Patent Abstracts of Japan Publication No. 05043341 Published Feb. 23, 1993.

(Continued)

*Primary Examiner*—Stanley Silverman
*Assistant Examiner*—Kallambella Vijayakumar
(74) *Attorney, Agent, or Firm*—Ladas & Parry LLP

(57) ABSTRACT

Disclosed is a three layer process for making contact points to a high transition temperature superconductor (HTSC), particularly to $(Bi,Pb)_2Sr_2Ca_2Cu_3O_{19+x}$ with and without silver in the superconductor. The contact structure is a three layer configuration with a perforated silver foil (3) sandwiched between two metal spray gun deposited silver layers (2,5) and subsequent heat treatment in air. The contact has been made on tubes and rods (1). The silver contacts are capable of carrying a continuous current of 200 Amps without adding any substantial heat load to the cryogen used to cool the HTSC. The contact resistance at 4.2 K is in the range of $1.5 \times 10^{-8}$ to $8.5 \times 10^{-8}$ $OHM$ in zero applied filed.

7 Claims, 1 Drawing Sheet

U.S. PATENT DOCUMENTS 6,216,333 B1    4/2001    Kojima et al.

FOREIGN PATENT DOCUMENTS

| JP | 04255203 |   | 9/1992  |
|----|----------|---|---------|
| JP | 06140234 | * | 10/1992 |
| JP | 05043341 | * | 2/1993  |
| JP | 06045141 |   | 2/1994  |
| JP | 06140234 |   | 5/1994  |
| JP | 06163255 |   | 6/1994  |

OTHER PUBLICATIONS

Patent Abstracts of Japan Publication No. 06163255 Published Jun. 10, 1994.
Patent Abstracts of Japan Publication No. 06140234 Published May 20, 1994.
Patent Abstracts of Japan Publication No. 06045141 Published Feb. 18, 1994.
Patent Abstracts of Japan Publication No. 04255203 Published Sep. 10, 1992.

* cited by examiner

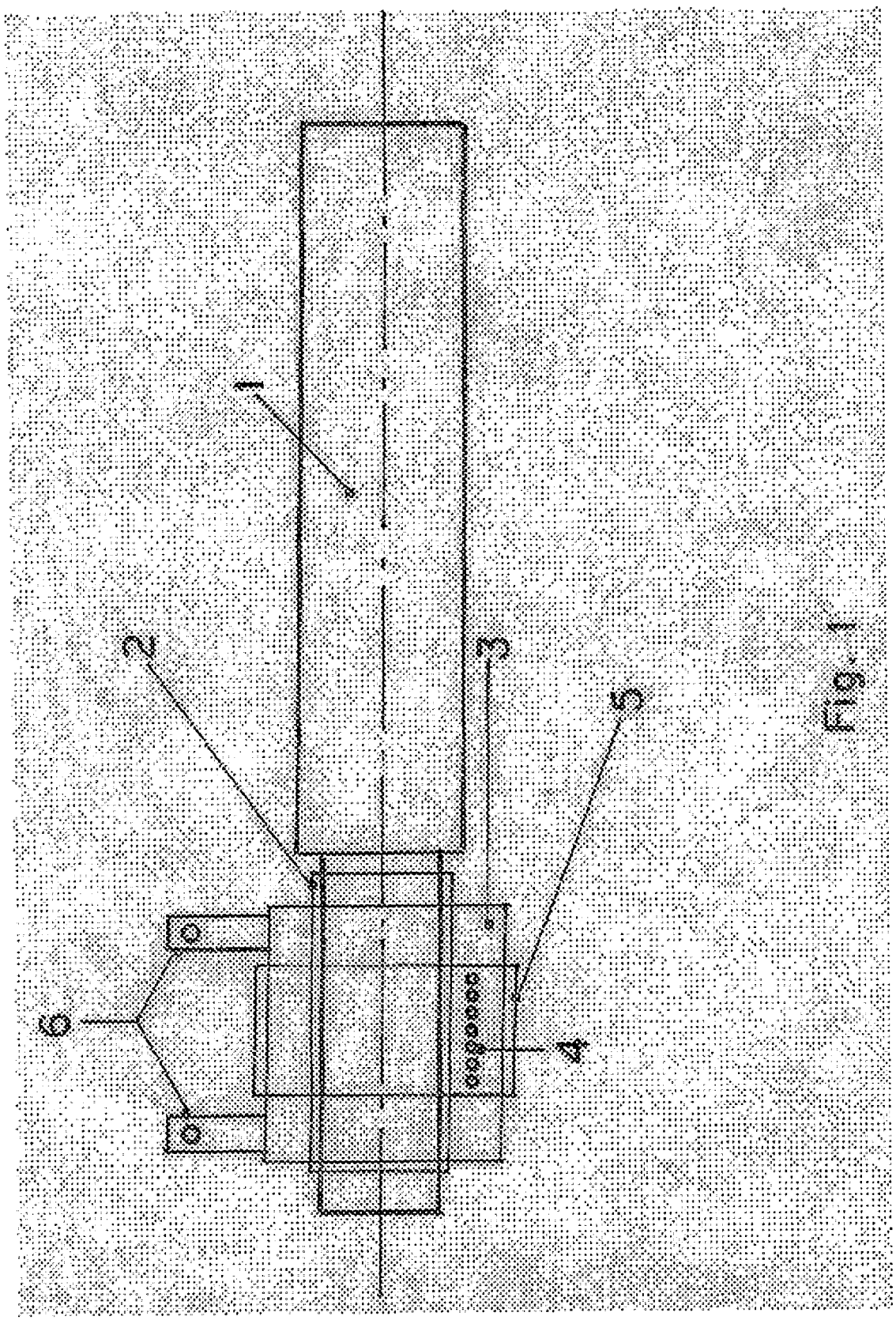

PROCESS FOR THE PREPARATION OF LOW CONTACT RESISTANT CONTACT ON A HIGH TRANSITION TEMPERATURE SUPERCONDUCTORS

FIELD OF INVENTION

The present invention relates to the development of low contact resistance joints on the solid bodies of HTSC (High Temperature Superconducting compound) of BiPbSrCaCuO for the transport of high currents below $T_c$ (critical temperature). The tube/rod conductors of HTSC Bi(2223) (BiPbSrCaCuO) are capable of carrying very high currents at 77K and due to their low thermal conductivity they produce very low thermal load on system. Moreover if the contact resistance between HTSC and the current lead is low these tube/rod conductors become ideal high current transport leads for any system like cryogen free superconducting magnets/superconducting magnet generators etc.

BACKGROUND ART

Parameters in high current transmission in conventional conductors like Cu, Al, etc. are mostly due to the resistance of the conductors, which produces a significant amount of energy loss. Loss-less transport of current has been the main point of attraction in superconductors from the very beginning. The low $T_c$ conventional superconducting materials have been used in making high field magnets (~20 tesla), which are now readily available. The operative temperature, i.e. 4.2K (requiring a constant flow of liquid of helium) has hampered the growth of high current carrying leads and cables. The advancements in this field of high transport current are restricted up to prototype level only. The advent of high $T_c$ superconducting compounds (HTSC) has raised the hopes for high transport current leads as the operating temperature is raised to 77K. However, poor ductility and low critical field had put restrictions on immediate applications. However the development of HTSC multifilamentary cables of Bi(2223) having $J_c$~$10^5$ A/cm$^2$ at 77K in a field 0.6 T showed a good promise but again they are not a very conventional answer. In comparison, the tube conductors of high $T_c$ superconductors have shown good potential. HTS current-leads based on BSCCO tubes and rods are the first applications of ceramic superconductors in electrical power engineering where they offer a major advantage over both, the conventional superconductors as well as the traditional all-metal leads of good conductors such as Cu and Al. Conventional low $T_c$ superconductors embedded in copper were considered a better option over all-metal leads because of their zero resistance and their capacity to transport high currents defined by their critical current density $J_c$ (~$10^5$ Amps/cm$^2$), but because of the restrictions of operation at 4.2K these materials could not always replace Cu or Al.

In addition to the higher operational temperature of 77K, the HTSC materials have their low thermal-conductivity, which reduces the heat-losses by more than a typical factor of 10. This reduces the heat load on the cryogenic system and results in a significant reduction in refrigeration cost and allows for new innovative cooling concepts. Their other applications are in the field of magnetic shielding and current-limiters.

All above utilization of HTSC tube conductors for high current application (Ic>1000 A) become ineffective and lossy if the contact resistance of the joints of the normal conductors (Cu, Al) feeding high currents to HTSC tube conductors are of the orders of $10^{-4}$-$10^{-3}\Omega$. The requirement to utilize the tube conductors to their optimum, the contact resistance of the normal conductors joining to HTSC tube conductors should be at least of the order of $10^{-6}\Omega$.

Reference may be made to disclosure by K H Sandhage et al. in Journal of Materials Vol 43, pp 21 (1991) wherein it is taught that among the HTSC family the Y-based superconductors suffer from many crystallographic limitations to synthesize tube and rod conductors and only thin film applications are commercialized. In yet another disclosure by E H Hellstorm in Materila Research Bulletin Vol XVII, pp 45, (1992) it has been taught that Tl based superconductors due to health hazards are not being used for bulk applications. Only Bi-based superconductors ($Bi_{2-x}Pb_xSr_2Ca_2Cu_3O_x$) and Bi(2212) are commercially economical and suitable answers as reported by S X Dou and H K Liu in Supercond. Science and Technol Vol 6, pp 297, (1993).

The contact resistance problem for high current electrical connection can only be solved using silver as normal conductors feeding the high current to Bi-based tube conductors. The major problem is to connect the silver feeder to Bi(2223) ceramic surface.

The problem has been tackled in parts in several ways:

U.S. Pat. No. 5,149,686 and a US Pat (publication No 20030132023) disclose sputtering the non-superconducting metal (Ag, Au) on small bar shaped HTSC of µm order for making the electrical contact.

Plasma spray technique of Ag/Au film on HTSC of µm order has been disclosed by Y Yamada in Bismuth Based High Temperature Superconductors Ed by H Maeda and T Togano pp 277 (1996).

Then the high current feeders have been soldered on HTSC surface and a contact resistance of the order of $10^{-6}\Omega$ has been achieved at 77K.

For small samples the sputtering technique has been successful but plasma deposition is used specially for bismuth based large samples like tube/rod conductors.

U.S. Pat. No. 5,506,199 and K K Michishita et al in Bismuth Based High Temperature Superconductors Ed by H Maeda and T Togano pp 253 (1996) disclose a process by partially encasing Ag tube, sheet or wire in large samples of Bi 2212 melt.

OBJECTS OF THE INVENTION

The main object of the present invention is to provide a process for the preparation of a low contact resistance contact on high transition temperature superconductors which obviates the drawbacks mentioned above.

Another object of the invention is to provide three layer process for the preparation of low contact resistance joint on high transition temperature superconductors.

Still another object of the present invention is to provide a low contact resistance to BiCaCuO superconductor.

A further object of the present invention is to provide a contact to a tubular HTSC.

A still further object of the present invention is to provide a contact to a rod HTSC.

Yet another object of the present invention is to provide a contact with a contact resistance in the range of $10^{-7}$ to $10^{-6}\Omega$.

SUMMARY OF THE INVENTION

The present invention describes a three layer process for making contact points to a high transition temperature superconductor (HTSC) particularly to $(Bi,Pb)_2 Sr_2 Ca_2 Cu_3 O_{10+x}$ with and without silver in the superconductor. The contact structure is a three layer configuration with a perforated silver foil sandwiched between two metal spray gun deposited silver layers and subsequent heat treatment in air. The contact has been made on tubes and rods. The silver contacts made have the characteristics of low resistance of $10^{-6}\Omega$. Further, the contacts are capable of carrying a continuous current of 200 Amps without adding any substantial heat load to the cryogen used to cool the HTSC.

BRIEF DESCRIPTION OF THE ACCOMPANYING DRAWINGS

In the drawings accompanying this specification
FIG. 1. shows the structure of the contact on the HTSC tube or rod. (1) is a HTSC tube or rod with grooves at the ends, (2) is the first deposited silver layer (3) is the silver foil, (4) are the perforations in the silver foil, (5) is the second deposited silver layer, and (6) are the contacts for braded leads.

DETAILED DESCRIPTION OF THE INVENTION

Accordingly the present invention provides a process for the preparation of a low contact resistance contact on high transition temperature superconductors which comprises making a groove at the end of the superconductor, depositing a first silver layer by metal spray gun at a temperature 120° C., heating the said deposited silver layer at a temperature in a range of 200-250° C. for a time period in the range of 2-5 hrs, wrapping a perforated silver foil on the said heat treated first silver layer, depositing a second silver layer by metal spray gun at a temperature of 120° C., heating the said combination of first silver layer, wrapped perforated silver foil and second silver layer at a temperature in a range of 830-850° C. in air for a time period in the range of 100-150 hrs resulting in a joint with a contact resistance in the range of $10^{-7}$ to $10^{-6}\Omega$.

In an embodiment of the present invention the high transition temperature superconductor may be a hollow cylindrical tube of length in a range of 200-300 mms In another embodiment of the present invention transition temperature superconductor may be a solid rod of length 150 mms.

In still another embodiment of the present invention the wall thickness of the tube may be in a range of 2-3 mms.

In yet another embodiment of the present invention the outer diameter of the tube may be in a range of 12-30 mms.

In yet another embodiment of the present invention the high transition temperature superconductor may be pure (Bi, Pb)$_2$ Sr$_2$ Ca$_2$ Cu$_3$O$_{10+x}$.

In a further embodiment of the present invention the high transition temperature superconductor may be (Bi,Pb)$_2$ Sr$_2$ Ca$_2$ Cu$_3$O$_{10+x}$ with 10 wt. % silver.

For making low contact resistance joints to the high transition temperature superconductors (HTSC), two types of samples were taken namely tubular and/or rod HTSC. FIG. 1 shows the HTSC sample (1). The dimensions of the tube ranged between 200 and 300 mms with an outer diameter in the range of 12-30 mm and wall thickness in the range of 2-3 mms. The ends of the tubes were machined to get a groove (2) of length of typically 20 mms. It is on these grooves that the contacts were made. Rod samples were of the dimensions of length of 150 mm and diameter in the range of 3-5 mm. HTSC samples used were (Bi,Pb)$_2$ Sr$_2$ Ca$_2$ Cu$_3$O$_{10+x}$ pure and with addition of 10 wt % silver.

The process of making the contacts is described hereunder.
The structure of the contact is shown in FIG. 1. First a layer of silver (3) metal was deposited on the groove (2) with the help of a metal spray gun with the temperature of the tube rising to about 120° C. This silver layer was heated to a temperature in the range of 250-300° C. for a time in the range of 2-5 hours in air. Next a silver foil (4) was taken and one surface was knurled and wrapped around the first spray deposited silver layer. The knurled surface was kept touching the first layer. The foil was perforated with equally spaced holes of diameter in the range of 1-1.5 mm and a maximum of 18 holes were used with three columns of holes. The strip was of width 2 cm with a length in the range of 4-6 cms. After the foil was wrapped completely leaving a small unwrapped portion (6) for making external contacts, a third layer (5) of silver was deposited with the help of metal spray gun with the HTSC sample temperature, maintained at 120° C. The final contact system was heated in air for a time in the range of 100-150 hrs at a temperature in the range of 830-850° C. The HTSC sample was then allowed to cool. External connections to all these samples were made to the silver metal ring by braded copper wires.

The resistivity of the contacts made by the procedure described above were measured by a four-probe method and are summarized in Table 1.

For four-probe method, the voltage taps were soldered directly to the superconductor close to the current contact. Two wires were attached to the current contact, one to carry current, and the other to detect voltage at the surface of the contact. The other voltage tap was soldered directly to the superconductor close to the current contact. Accuracy of the measurements was about ±10%. The measurements were taken both with and without magnetic field and at sample temperature of m77K and 4.2K.

Optionally a two layer structure was also prepared which essentially consisted of first layer deposited by metal spray gun and the perforated silver foil. The final assembly being heated inn air for a temperature in the range of 830-850° C. for a time in the range of 100-150 hrs. However, the contact resistance was observed to be in the range of $10^{-5}\Omega$.

The low specific resistance materials and HTSC cables can be used to energize superconducting magnets and other non-superconducting devices requiring high current transport as at 77K. Specific resistance of Cu is of the order of $10^{-9}\Omega$-m. The specialty of the tube conductors is due to zero loss and very low thermal conductivity of material.

Especially devices which require very low power loss or low thermal load in current transport, tube conductors with low contact resistance are essential; like cryogen free magnetic systems where a close cycle system produces 10K temperature, any thermal load more than 1 W becomes hazardous, only tube conductors are used.

The importance of low contact resistance joint is vital in these devices. Moreover low thermal conductivity is $\frac{1}{10}^{th}$ that of Cu makes it the first choice to avoid cryogen losses in conventional uses of high transport current.

Novelty of the invention lies in the low contact resistance of $10^{-7}$ to $10^{-6}\Omega$, and current carrying capacity of 200 Amps continuously for at least 2 hours. without adding any heat load to the cryogen.

The said novelty has been achieved due to the non obvious inventive steps of taking a three layer fabrication process and using a perforated silver foil sandwiched between the metal spray gun deposited silver layers.

Following examples are given by way of illustration only and should not be construed to limit the scope of the invention.

EXAMPLE 1

A tube of $(Bi,Pb)_2$ $Sr_2$ $Ca_2$ $Cu_3O_{10+x}$ high temperature superconductor with 10 wt. % Silver was taken and groves at its ends were made. The length of the tube was 305 mm and the outer diameter of the tube was 12.4 mm with a wall thickness of 2.4 mm. First silver layer was deposited on the grooves by thermal metal spray gun at a temperature of 120° C. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance was measured for this at a 77K and in zero applied magnetic field and the value achieved was $5.1 \times 10^{-6} \Omega$.

EXAMPLE 2

A tube of $(Bi,Pb)_2$ $Sr_2$ $Ca_2$ $Cu_3O_{10+x}$ high temperature superconductor with 10 wt. % Silver was taken and groves at its ends were made. The length of the tube was 300 mm and the outer diameter of the tube was 12.4 with a wall thickness of 2.4 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance was measured for this at a 77K and in zero applied magnetic field and the value achieved was $2.02 \times 10^{-7} \Omega$.

EXAMPLE 3

A tube of $(Bi,Pb)_2$ $Sr_2$ $Ca_2$ $Cu_3O_{10+x}$ high temperature superconductor with 10 wt % Silver was taken and groves at its ends were made. The length of the tube was 300 mm and the outer diameter of the tube was 12.4 mm with a wall thickness of 2.4 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance measured for this at 4.2K and in zero applied magnetic field was $1.5 \times 10^{-8} \Omega$.

EXAMPLE 4

A tube of $(Bi,Pb)_2$ $Sr_2$ $Ca_2$ $Cu_3O_{10+x}$ high temperature superconductor with 10 wt % Silver was taken and groves at its ends were made. The length of the tube was 300 mm and the outer diameter of the tube was 12.4 mm with a wall thickness of 2.4 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance measured for this at 77K and in applied magnetic field of 0.09 Tesla was $4.8 \times 10^{-7} \Omega$.

EXAMPLE 5

A tube of $(Bi,Pb)_2$ $Sr_2$ $Ca_2$ $Cu_3O_{10+x}$ high temperature superconductor without Silver was taken and groves at its ends were made. The length of the tube was 300 mm and the outer diameter of the tube was 12.4 mm with a wall thickness of 2.4 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance measured for this at a 77K and in zero applied magnetic field was $6.09 \times 10^{-7} \Omega$.

EXAMPLE 6

A tube of $(Bi,Pb)_2$ $Sr_2$ $Ca_2$ $Cu_3O_{10+x}$ high temperature superconductor without Silver was taken and groves at its ends were made. The length of the tube was 300 mm and the outer diameter of the tube was 12.4 mm with a wall thickness of 2.4 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each.

One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance measured for this at a 4.2K and in zero applied magnetic field was $8.5 \times 10^{-8} \Omega$.

EXAMPLE 7

A tube of $(Bi,Pb)_2\ Sr_2\ Ca_2\ Cu_3O_{10+x}$ high temperature superconductor without Silver was taken and groves at its ends were made. The length of the tube was 305 mm and the outer diameter of the tube was 12.4 mm with a wall thickness of 1 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance measured for this at a 77K and in 0.03 Tesla applied magnetic field was $9.5 \times 10^{-7} \Omega$.

EXAMPLE 8

A tube of $(Bi,Pb)_2\ Sr_2\ Ca_2\ Cu_3O_{10+x}$ high temperature superconductor with 10 wt % Silver, was taken and groves at its ends were made. The length of the tube was 200 mm and the outer diameter of the tube was 30.8 mm with a wall thickness of 2.8 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance measured for this at 77K and in zero applied magnetic field was $3.8 \times 10^{-7} \Omega$.

EXAMPLE 9

A tube of $(Bi,Pb)_2\ Sr_2\ Ca_2\ Cu_3O_{10+x}$ high temperature superconductor with 10 wt % Silver, was taken and groves at its ends were made. The length of the tube was 200 mm and the outer diameter of the tube was 30.8 mm with a wall thickness of 2.8 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance measured for this at 4.2K and in zero applied magnetic field was $2.3 \times 10^{-8} \Omega$.

EXAMPLE-10

A rod of $(Bi,Pb)_2\ Sr_2\ Ca_2\ Cu_3O_{10+x}$ high temperature superconductor with 10 wt % Silver, was taken and groves at its ends were made. The length of the rod was 150 mm and the diameter 0.3 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance measured for this at 77K and in zero applied magnetic field was $3.7 \times 10^{-7} \Omega$.

EXAMPLE 11

A rod of $(Bi,Pb)_2\ Sr_2\ Ca_2\ Cu_3O_{10+x}$ high temperature superconductor with 10 wt % Silver, was taken and groves at its ends were made. The length of the rod was 150 mm and the diameter 3 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance measured for this at a 4.2K and in zero applied magnetic field was $4.05 \times 10^{-8} \Omega$.

EXAMPLE 12

A rod of $(Bi,Pb)_2\ Sr_2\ Ca_2\ Cu_3O_{10+x}$ high temperature superconductor with 10 wt % Silver, was taken and groves at its ends were made. The length of the rod was 150 mm and the diameter 5 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance measured for this at a 77K and in zero applied magnetic field. was $3.0 \times 10^{-7} \Omega$.

EXAMPLE 13

A rod of $(Bi,Pb)_2 Sr_2 Ca_2 Cu_3O_{10+x}$ high temperature superconductor with 10 wt % Silver, was taken and groves at its ends were made. The length of the rod was 150 mm and the diameter 5 mm. First silver layer was deposited on the grooves by thermal metal spray gun at a temperature of 120° C. followed by heating at a temperature of 250° C. for 2 hrs. A silver metal foil of width 2 cm was taken and perforations with hole diameter of 1 mm and 18 holes were made in 3 columns each. One surface of the foil was knurled. This foil was then wrapped round the first silver layer with the knurled surface of the silver foil touching the first silver layer. After this a second silver layer was deposited by thermal metal spray gun at a temperature of 120° C. on the combination of first silver layer and the wrapped perforated silver foil. This entire three layered structure was sintered in air for 100 hrs. at 830° C. To establish electrical contacts to this silver contacts holes were made at the ends of the perforated silver foil at its end and high current leads were connected. Contact resistance measured for this at 4.2K and in zero applied magnetic field was $4.7 \times 10^{-8} \Omega$.

The resistivity of the contacts made by the procedures described in the aforementioned examples were measured by a four-probe method and are summarized in Table 1.

For four-probe method, the voltage taps were soldered directly to the superconductor close to the current contact. Two wires were attached to the current contact, one to carry current, and the other to detect voltage at the surface of the contact. The other voltage tap was soldered directly to the superconductor close to the current contact. Accuracy of the measurements was about ±10%.

External connections to all these samples were made to the silver metal ring by braded copper wires.

TABLE 1

| Sample in Example | Temperature (K) | Magnetic Field (T) | Contact Resistance $R_c (\Omega)$ |
|---|---|---|---|
| 1. | 77 | 0 | $5.1 \times 10^{-6}$ |
| 2 | 77 | 0 | $2.02 \times 10^{-7}$ |
| 3. | 4.2 | 0 | $1.5 \times 10^{-8}$ |
| 4. | 77 | 0.09 | $4.8 \times 10^{-7}$ |
| 5. | 77 | 0 | $6.09 \times 10^{-7}$ |
| 6. | 4.2 | 0 | $8.5 \times 10^{-8}$ |
| 7. | 77 | 0.03 | $9.5 \times 10^{-7}$ |
| 8. | 77 | 0 | $3.8 \times 10^{-7}$ |
| 9. | 4.2 | 0 | $2.3 \times 10^{-8}$ |
| 10. | 77 | 0 | $3.7 \times 10^{-7}$ |
| 11 | 4.2 | 0 | $4.05 \times 10^{-8}$ |
| 12 | 77 | 0 | $3.0 \times 10^{-7}$ |
| 13 | 4.2 | 0 | $4.7 \times 10^{-8}$ |

We claim:

1. A process for the preparation of a low contact resistance contact on a high transition temperature superconductor which comprises making a groove at the end of the superconductor, depositing a first silver layer by metal spray gun at a temperature 120° C., heating the said deposited silver layer at a temperature in a range of 200-250° C. for a time period in the range of 2-5 hrs, wrapping a perforated silver foil on the said heat treated first silver layer, depositing a second silver layer by metal spray gun at a temperature of 120° C., heating the said combination of first silver layer, wrapped perforated silver foil and second silver layer at a temperature in a range of 830-850° C. in air for a time period in the range of 100-150 hrs resulting in a joint with the superconductor.

2. A process as claimed in claim 1, wherein the high transition temperature superconductor is a hollow cylindrical tube of length in a range of 200-305 mms.

3. A process as claimed in claim 2, wherein wall thickness of the tube is in a range of 1-3 mms.

4. A process as claimed in claim 2, wherein outer diameter of the tube is in the range of 10-20 mms.

5. A process as claimed in claim 1, wherein the high transition temperature superconductor is a solid rod of length in a range of 200-305 mms.

6. A process as claimed in claim 1, wherein the high transition temperature superconductor is pure $(BiPb)_2 Sr_2 Ca_2 Cu_3O_{10+x}$.

7. A process as claimed in claim 1, wherein the high transition temperature superconductor is $(BiPb)_2 Sr_2 Ca_2 Cu_3O_{10+x}$ with 10% silver.

* * * * *